United States Patent [19]

Kosugi

[11] Patent Number: 5,120,134
[45] Date of Patent: Jun. 9, 1992

[54] EXPOSURE SYSTEM INCLUDING A DEVICE FOR ANALYZING AN AFFECT OF A WAFER RESIST UPON A MARK SIGNAL

[75] Inventor: Masao Kosugi, Yokohama, Japan

[73] Assignee: Canon Kabushiki Kaisha, Tokyo, Japan

[21] Appl. No.: 675,058

[22] Filed: Mar. 26, 1991

Related U.S. Application Data

[63] Continuation of Ser. No. 454,681, Dec. 21, 1989, abandoned.

[30] Foreign Application Priority Data

Dec. 23, 1988 [JP] Japan ............... 63-326512

[51] Int. Cl.⁵ .................................. G01B 11/00
[52] U.S. Cl. ................... 356/401; 250/548; 353/53
[58] Field of Search .......... 356/399, 400, 401; 250/548, 561, 491.1; 355/53

[56] References Cited

U.S. PATENT DOCUMENTS

| | | | |
|---|---|---|---|
| 4,795,261 | 1/1989 | Nakata et al. | 356/401 |
| 4,834,540 | 5/1989 | Totsuka et al. | 356/401 |
| 4,886,974 | 12/1989 | Ina | 250/548 |
| 4,906,852 | 3/1990 | Nakata et al. | 356/401 |
| 4,952,060 | 8/1990 | Ina et al. | 356/401 |
| 4,962,318 | 10/1990 | Nishi | 250/548 |
| 4,971,444 | 11/1990 | Kato | 356/375 |

FOREIGN PATENT DOCUMENTS 0163199 12/1985 European Pat. Off.
60-120360 6/1985 Japan.

OTHER PUBLICATIONS

Kuniyoshi, et al., "Contrast Improvement of Alignment Signals from Resist Coated Patterns," J. Vac. Sci. Technol., Mar./Apr. 1987, pp. 555-560.

Primary Examiner—F. L. Evans
Attorney, Agent, or Firm—Fitzpatrick, Cella, Harper & Scinto

[57] ABSTRACT

An exposure system for exposing a wafer coated with a resist to a mask is disclosed. The system includes a photoelectric converting device for photoelectrically converting, through a detection optical system, an alignment mark formed on the wafer; an analyzing device for analyzing an affect of the resist on the wafer to a mark signal from the photoelectric converting device; and a control device for controlling the position of the wafer in relation to the mask, by using the mark signal from the photoelectric converting device and a result of analysis by the analyzing device.

7 Claims, 15 Drawing Sheets

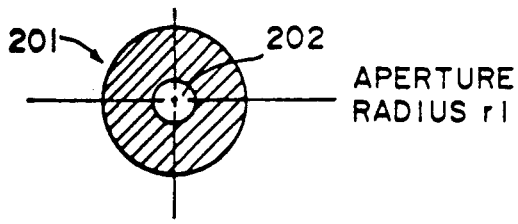
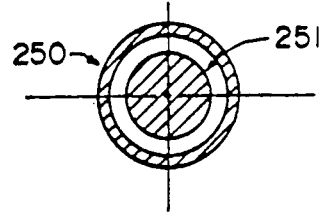
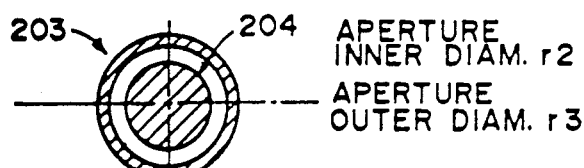
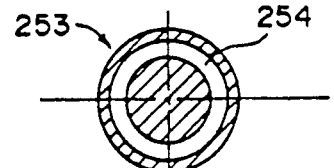
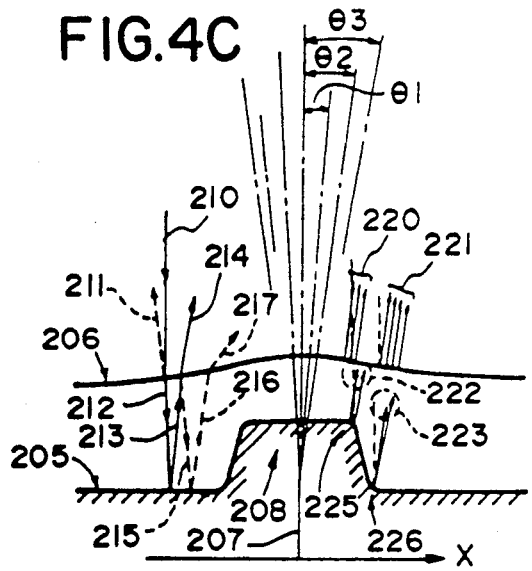
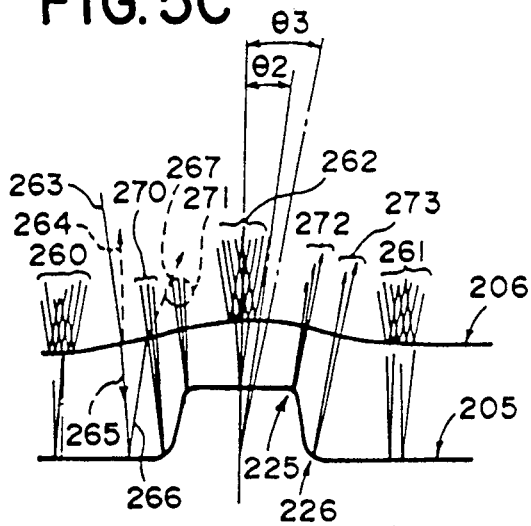
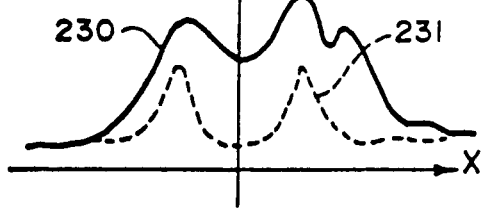
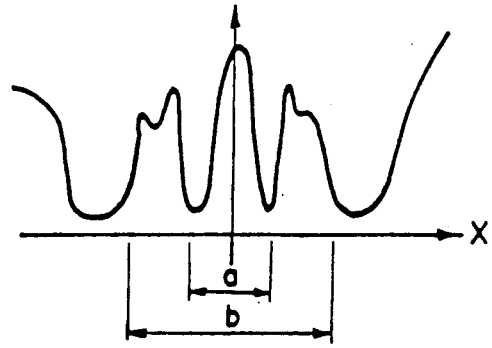

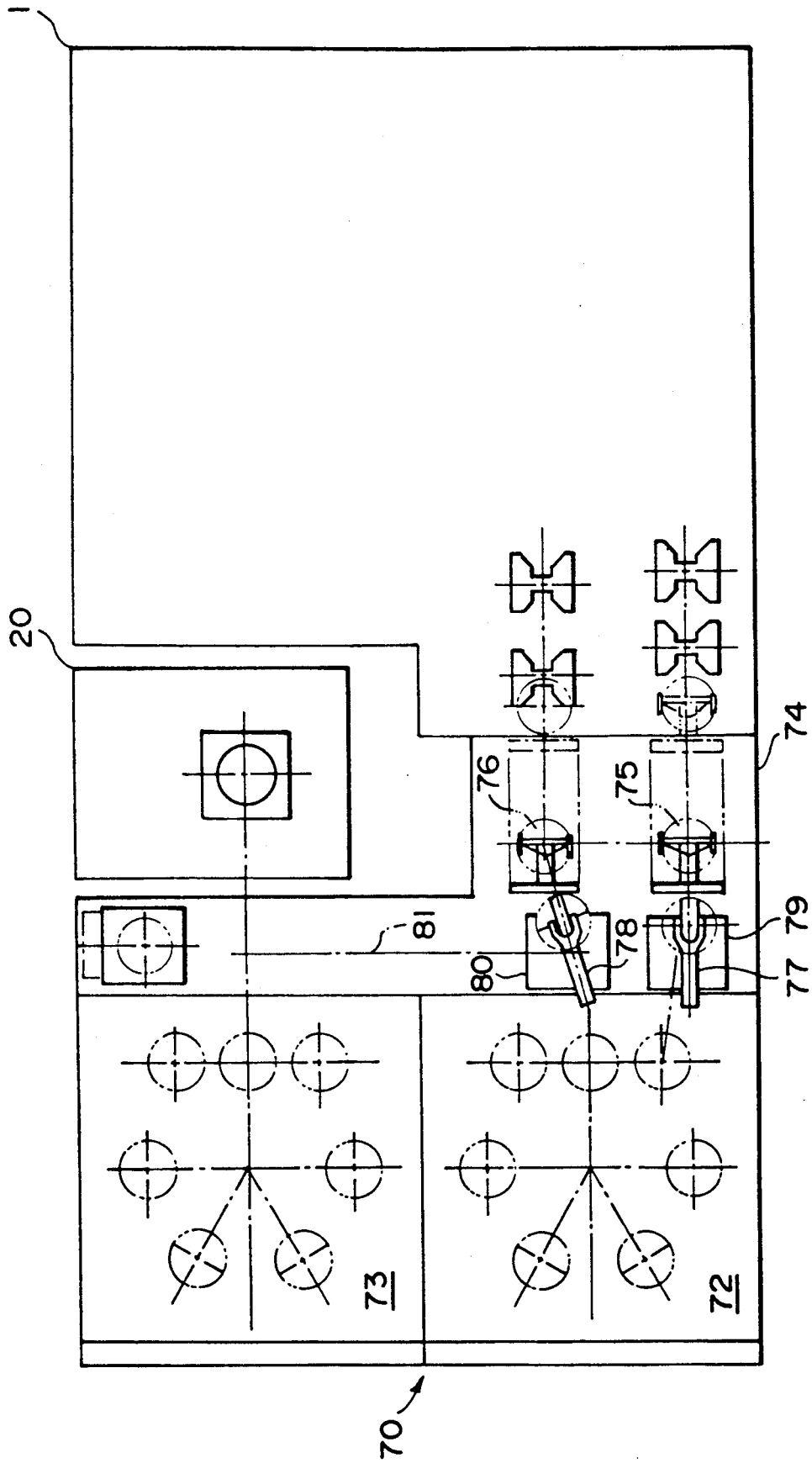

EXPOSURE SYSTEM INCLUDING A DEVICE FOR ANALYZING AN AFFECT OF A WAFER RESIST UPON A MARK SIGNAL

This application is a continuation of application Ser. No. 07/454,681 filed Dec. 21, 1989, now abandoned.

FIELD OF THE INVENTION AND RELATED ART

This invention relates to an exposure system usable in a process for manufacture of semiconductor devices and, more particularly, to an exposure system for printing, in a step-and-repeat manner, a pattern of a reticle superimposingly upon each of patterns formed on a wafer in a predetermined order.

The apparatus which functions as a core of a photolithography process in the manufacture of semiconductor devices is called, in a broad sense, an aligner. Currently, in order to satisfy the requirements of miniaturization of the device, steppers are used prevalently.

As regards the performance required for the aligner, a first one is to transfer a fine circuit pattern provided on an original, i.e., a photomask or reticle (hereinafter simply "reticle"), onto a photosensitive material layer (hereinafter "resist") applied to a semiconductive substrate (hereinafter "wafer"). A second one is to accurately align the pattern of the reticle with a circuit pattern already formed on the wafer. Hereinafter, the second operation will be referred to as "alignment". With further miniaturization and increasing density of integration of the semiconductor device, these two major performances are required to be improved to a higher level. As an example, for a currently produced 1 megabit DRAM, the minimum resolution is about 1.0 micron and the alignment precision is about 0.15 micron. However, for a 16 megabit DRAM which is being developed, resolution not greater than 0.5 micron and alignment precision not greater than 0.1 micron are required.

Conventionally, these alignment and exposure processes are executed in one independent apparatus, called "aligner". For example, in a stepper, a pattern of a reticle is transferred to a wafer through a projection lens system and, by using a microscope which can observe the reticle and the wafer through the projection lens system, the relative position of them is adjusted.

SUMMARY OF THE INVENTION

A problem underlying the present invention is an expected difficulty in accomplishing the alignment precision to be required in the future, with a stepper (aligner) of a known type as described above. This will be explained in detail. The prime problem in the alignment is the precision of wafer detection. This concerns the fact that what can be called a "pattern" of the wafer shows many varieties of states, varying with the manufacturing processes. More specifically, each wafer pattern is formed by a minute surface height difference (recess or protrusion), and there is a great variety with respect to the material, the magnitude of height difference, the shape and the surface state. Additionally, a resist is applied to the wafer and the applied resist has a surface shape like a curved surface, following the surface height difference of the substrate, underlying it. In an optical sense, the resist has an effect of a lens or mirror Also, while it may be a more serious problem, the underlying surface height difference and the resist are formed asymmetrically with respect to those which are to be formed normally.

It is considered that the fact that, while in the case of a reticle wherein a thin Cr layer is formed on a quartz substrate and a pattern is formed thereon by etching it is possible to obtain good contrast of light and superior detection precision of about 0.02 micron, for some kind of wafer pattern only a precision of about 0.2–0.3 micron is attainable, depending on the background as described above.

When these states of wafer pattern are systematically analyzed with respect to the manufacturing process, the following is obtained:

(1) Difference with Process

For example, a wafer having been subjected to an oxidizing process has a surface layer of $SiO_2$ that can transmit light, whereas after a metal process a surface layer of Al is formed. These layers have different sectional shapes and have a large difference in the optical characteristics.

(2) Difference with Lot

In the manufacturing device the parameter of each process are measured, and the results of the measurement are utilized as the conditions set for the succeeding process. As a result, the state of a wafer is variable with the lot.

(3) Difference among Wafers in a Lot

Normally, in a manufacturing process, regardless of whether it is a sheet process or a batch process, the wafers in a lot should be processed to avoid creation of a difference among the wafers. Actually, such a difference is so small that it cannot be discriminated.

(4) Difference among Shots (Chips) of a Wafer

Depending on the position on a wafer, there may be a difference in the shape of a pattern or the state of an applied resist. It has been confirmed that such a difference practically occurs as a result of aluminum sputtering or due to spinning application of the resist. When such a wafer is subjected to die-by-die alignment and exposure by using a stepper, there may occur a phenomenon that alignment errors are produced radially from the center of the wafer, such as shown in FIG. 11.

(5) Breakage of Pattern

Independently of the differences (1)–(4), breakage occurs sometimes.

For such wafer patterns having many varieties of states, normally it will be proper to prepare detection optical systems and signal processing systems best-suited to these patterns, respectively. By way of example, as for the parameters of the optical system, there are a wavelength, a bandwidth, a numerical aperture of an objective system, an illumination method and so on. This is also with the case with the signal processing system. In summary, as for the optical system, the optimization is to emphasize a signal from a different surface height portion (i.e. a true signal) and to remove a false signal or a noise component, resulting from the resist surface reflection or film thickness interference. As for the signal processing system, the optimization is to emphasize the trueness of a signal in which trueness and falseness are contained and to reduce the falseness.

Practically, however, whether such a degree of freedom can be prepared at the stepper (aligner) side is a first problem. For example, in a stepper, a TTL (through the lens) system using a projection lens is considered advantageous with respect to a system error, but in this case, due to the restriction of the projection lens, the alignment wavelength and its bandwidth are limited strictly. A second problem is limitation in time. Since a stepper (aligner) is a device manufacturing apparatus, the processing time thereof is a concern. For example, the time permitted in a current stepper for the alignment process per one shot is not longer than 0.5 sec. and about 0.3 sec. It is almost impossible to discriminate such an optical system and a signal processing system to be properly selected to a newly introduced wafer pattern, to interchange the hardware and software and to execute the alignment, within such a short period of time.

A third problem is that, even if there is no limitation in time, it is difficult to discriminate a processing method to be selected to a given wafer pattern, only by the use of an optical system and a signal processing system having a small degree of freedom as discussed with reference to the first problem.

Preparative information which can be supplied to a stepper, at present, is only the one, among those systematically analyzed in the foregoing, that concerns the process of wafers just going to be supplied.

As explained hereinbefore, it is expected that with mere prolongation of the present status, it is difficult to accomplish the alignment precision not greater than 0.1 micron, constantly for wafer patterns having many varieties of states.

It is accordingly an object of the present invention to provide an exposure system by which high alignment precision can be accomplished constantly for wafer patterns having many varieties of states.

In an aspect of the present invention, it is intended to solve the inconveniences described above, by structuring an exposure system with the addition of a wafer pattern analyzing device to an aligner (stepper). As a basic structure, the wafer pattern analyzing device may comprise (a) an optical detection system and a photoelectric converting function (means) having a degree of freedom higher than that of the stepper; (b) a stage (means) for changing the position of wafer observation; (c) an operating means for executing the signal processing and/or for executing simulation on the basis of the result of processing; and (d) a control means operable to discriminate, as a result of the signal processing, an optimum processing method to be adopted at the stepper side and to transmit necessary information to the stepper side. Further, not to mention the combination with the aligner (stepper), the wafer pattern analyzing device may be combined with a coater/developer into an in-line structure and, then, the resultant is a flexible intelligent system having an ability of attaining a higher alignment precision.

The functions of these components will be explained briefly. First, of the states of the wafer pattern analyzed hereinbefore, as for the difference with the process (Item (1)), which process of wafers are going to be supplied is obtainable in the form of preparative information. Therefore, it is possible to prepare the analyzing device and the stepper to meet that process, beforehand. Next, with regard to the difference with the lot (Item (2)), it is possible to extract the characteristic of the lot as a whole, by selecting at least one wafer in the lot as a sample and by analyzing the selected wafer. The difference among wafers (Item (3)) is quite small and can be disregarded. As regards the difference among shots (Item (4)), in consideration of that the wafers in the same lot have been subjected to the same process, it is expected that there is the same tendency in the lot. Therefore, sampling of at least one wafer is sufficient.

In summary, the analyzing device can perform its minimum function, once it analyzes at least one wafer in the lot. By this, it is possible to obtain the degree of freedom with respect to the time, discussed with reference to the second problem. More particularly, the productivity is not deteriorated if a time period of about 20 sec., from the introduction of a first wafer in the lot into the analyzing device to the placement of a second wafer on a stage of the stepper, is used. Also, if the analyzing device and the stepper are systematized in a one-to-one relation, through continuous or intermittent processing of wafers the analyzing device can operate to detect the difference among the wafers (Item (3)), with a result of enhancement of the certainty of the information supplied to the stepper.

As regards the optical detection system of the analyzing device, there is no optical or spatial limitation, as those of the projection lens of the stepper. Therefore, it is possible to adopt a design having a high degree of freedom with respect to the wavelength, the numerical aperture (NA) and other parameters. It is therefore possible to solve the problem (1). As a result of this, by changing a parameter or parameters to a given sample, it is possible to obtain data which concerns the states of the sample. By effecting simulation as to what signal is obtained if the sample is processed by a detecting system at the stepper side, then it is possible to provide an optimal solution of the hardware and software to the stepper side. The stepper receives it and processes the wafer in accordance with a designated method, whereby highest alignment precision can be accomplished.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A through 4D are representations showing details of the alignment mark section and the alignment signal of FIG. 3.

FIGS. 5A through 5D are representations, for explaining the state of simulation in a wafer pattern analyzing device of FIG. 1.

FIG. 6 is a top plan view, schematically showing an embodiment wherein a coater/developer is added to the exposure system of FIG. 1, into an in-line structure.

DESCRIPTION OF THE PREFERRED EMBODIMENTS

Figure 1:
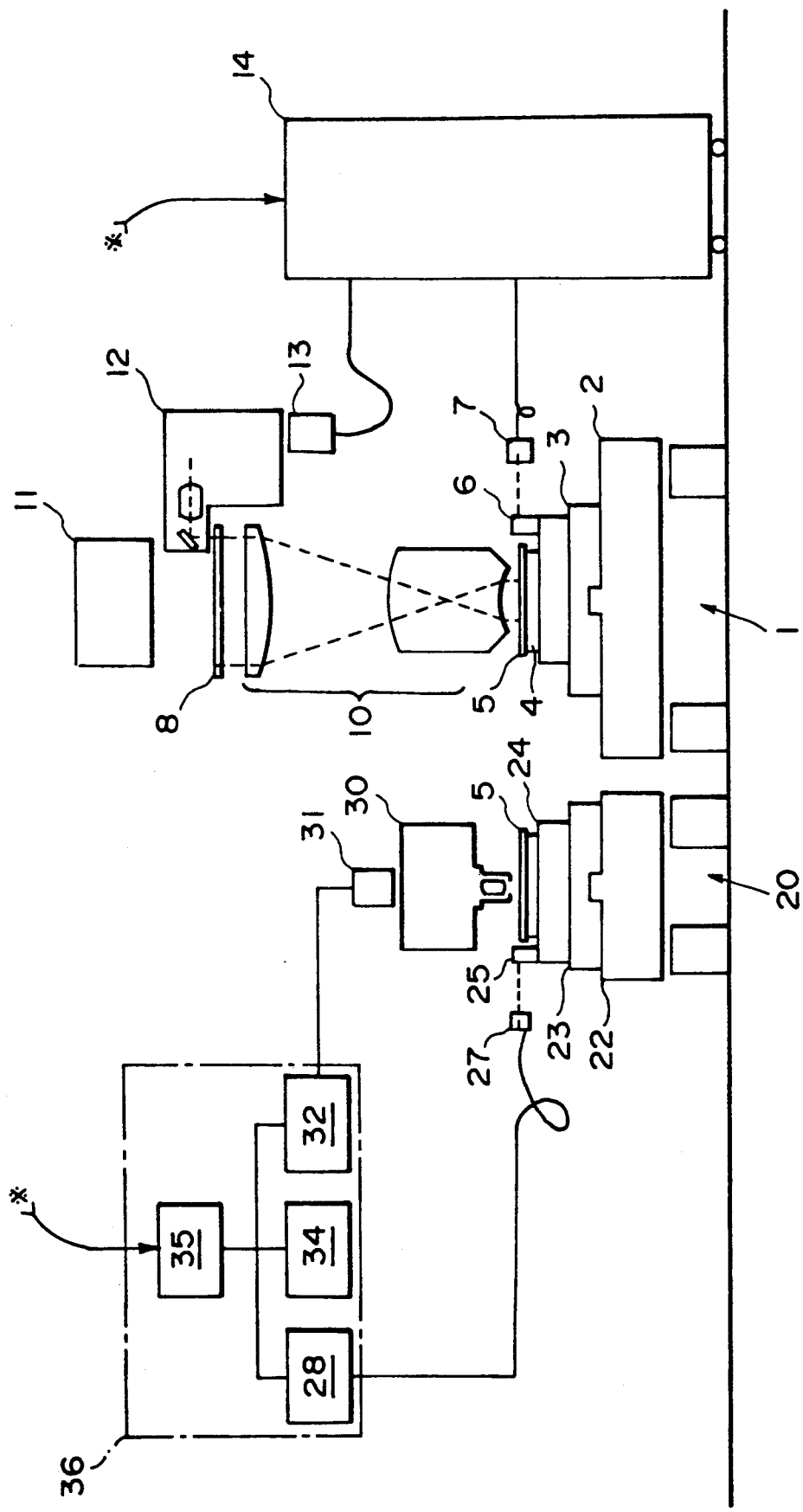
FIG. 1 is a schematic and diagrammatic view showing the basic structure of an exposure system according to the present invention.

FIG. 1 schematically shows the basic structure of an embodiment of the present invention, as combined with a stepper. The stepper has a main assembly 1 which comprises, from below, a base surface plate 2, an X-Y stage 3 and a wafer chuck 4 stacked in this order. Wafer 5 is held on the wafer chuck 4. Mirror 6 is placed on the X-Y stage 3, so that by using a laser interferometer 7 the position of the stage 3 can be measured. Projection lens system 10 is disposed between a reticle 8 and the wafer 5. Each time the wafer 5 is moved stepwise in the X and/or Y direction through the X-Y stage 3, exposure light (printing light) is projected by an illumination optical system 11, whereby a pattern of the reticle 8 is projected and printed on one shot area of the wafer 5. TTL microscope 12 disposed above the reticle 8 allows simultaneous observation of a reticle pattern and an inversely projected image of a wafer pattern through the projection lens system 10. Photoelectric converting element (CCD) 13 attached to the TTL microscope 12 serves to convert an optical signal into an electronic signal which is supplied to a control circuit 14. Since the basic structure of the stepper is known, a control circuit, a memory and computing circuit and the like are all represented by the control circuit 14.

The wafer analyzing device includes a main assembly 20 which is disposed adjacent the stepper main assembly 1. The lower half of the main assembly 20 comprises, like the stepper main assembly 1, a surface plate 22, an X-Y stage 23, a wafer chuck 24 and a mirror 25. Like the stepper 1, a wafer 5 can be moved stepwise in each of the X and Y directions. The wafer 5 is held on the wafer chuck 24. The position of the stage can be monitored by means of a laser interferometer 27 and an interferometer signal processing circuit 28.

By means of a wafer conveying device, not shown, a wafer can be transported between the stepper and the analyzing device. Microscope 30 is disposed above the wafer 5. Photoelectric converting element 31 attached to the microscope 30 serves to convert an optical signal obtained from a wafer pattern into an electric signal which is supplied to a wafer signal processing circuit 32. Based on the judgment made in a control circuit 35, in some case, the signal outputted from the wafer signal processing circuit 32 is subjected to simulation by a simulator 34. The data, information or instruction having been processed by an analyzer control unit 36, comprising the described elements, is supplied from the control circuit 35 to the control circuit 14 at the stepper side. As a matter of course, in the one-to-one structure of a stepper and an analyzer as described above, the control unit 36 may be included in the control circuit 14 of the stepper side, without inconveniences.

Next, the wafer pattern analyzing device will be explained in greater detail. First, as a practical example of the microscope 30, a laser scanning microscope well-known in the art and already commercially available, can be used conveniently. With such a laser scanning microscope, not only is it possible to obtain a simple plane image, but it is also possible to trace the surface height profile of a sample. Further, it is possible to measure the dimension of a pattern. Moreover, as a laser light source, an He-Ne laser, an Ar laser or otherwise may be used to effect observation with use of one of or a combination of three colors of RGB (red, blue and green).

In the present embodiment, description will be made of an example, of this function, where sectional shape profile information is used. The profile of the surface step structure of an alignment mark portion of a wafer 5 as well as the profile of the resist surface are detected as signals. The detected and underlying surface step profile contains an error due to the presence of the resist and, thus, by an amount corresponding to the refractive index of the resist. However, if the refractive index is known, it can be corrected. Alternatively, the refractive index can be calculated from the data related to the individual wavelengths of R, G and B, and the error can be corrected. These calculations can be made by using the processing circuit 32.

Figure 3A:
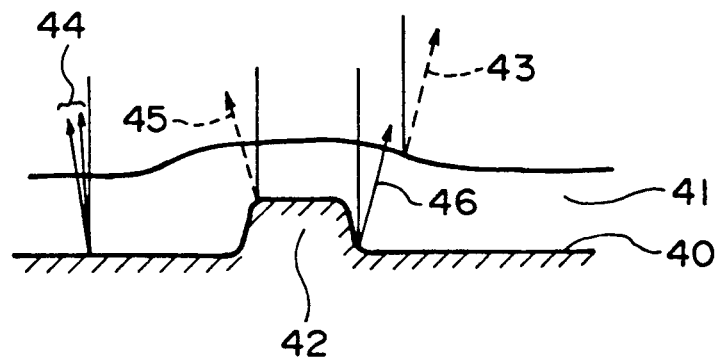
FIG. 3A is a schematic section of an alignment mark provided on a wafer.
Figure 3B:
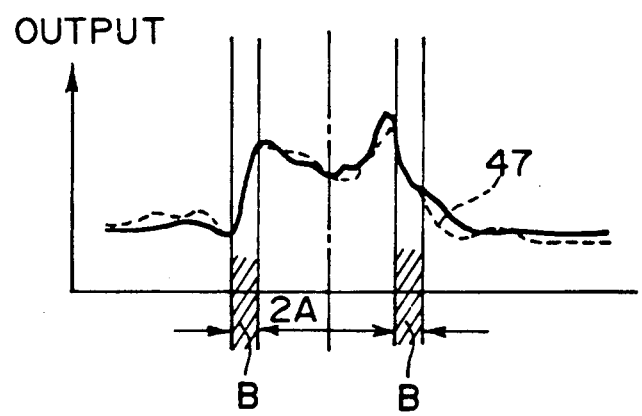
FIG. 3B is a representation showing an alignment signal obtainable from the alignment mark of FIG. 3A.

As a result of this, the sectional shape of the alignment mark portion of the wafer 5 is obtained, as exemplified in FIG. 3A. If this is subjected to the simulation by using the simulator 34 of FIG. 1, assuming that it is detected through an optical system at the stepper side, then a simulation signal 47 such as depicted by a broken line in FIG. 3B is obtainable.

The procedure will be explained in more detail.

Figure 2:
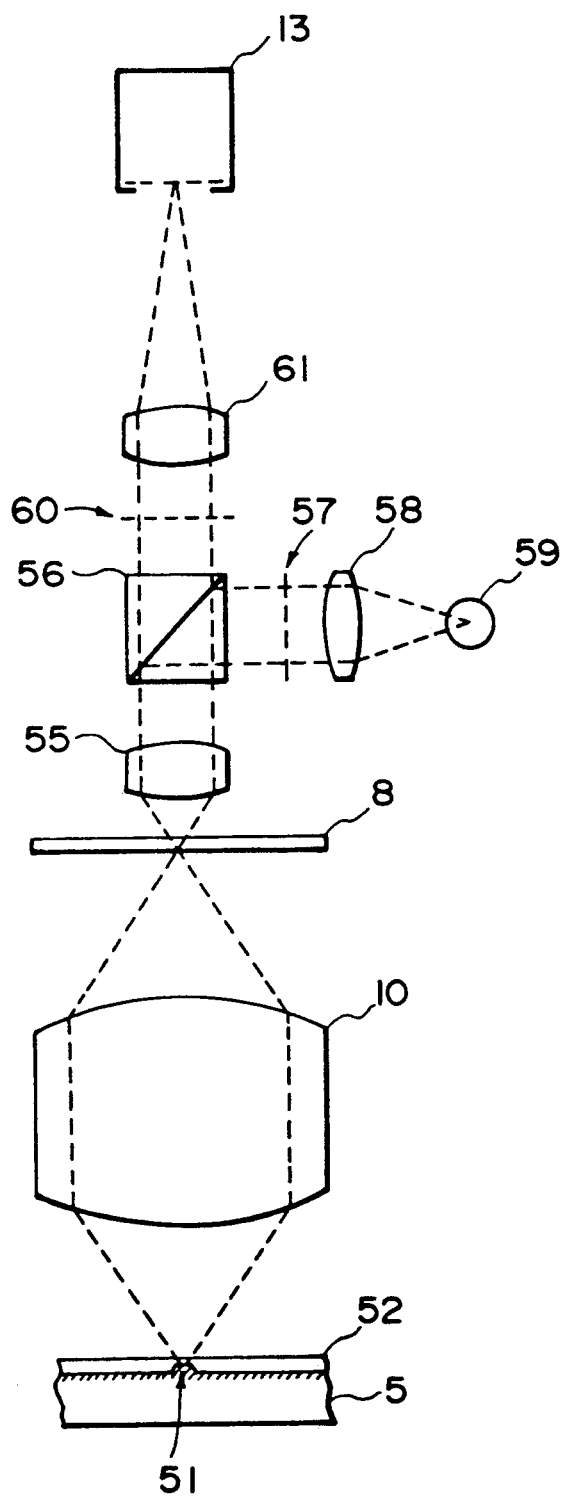
FIG. 2 is a schematic view of an optical system of a stepper shown in FIG. 1.

FIG. 2 illustrates details of the optical arrangement of the stepper 1 shown in FIG. 1. In this embodiment, the alignment system is of a TTL on-axis type. Therefore, the alignment light has substantially the same wavelength as of the exposure light, and the wavelength range is only ten plus a few nanometers. Light source 59 shown in FIG. 2 is one that emits such an illumination light. The illumination light goes through an illumination lens 58 and an illumination stop 57, is deflected downwardly by a beam splitter 56, is once focused on the reticle 8 by an objective lens 55, and is re-imaged by the projection lens system 50 to thereby illuminate an alignment mark 51 portion of the wafer 5. The wafer 5 is covered by a resist 52.

The light reflected by the alignment light portion goes backwardly along its on-coming path and, after passing the projection lens system 10, the reticle 8 and the objective lens 55, it goes through the beam splitter 56. Thereafter, the light passes through a pupil filter 60 and, by means of a relay lens 61, it is imaged on a light receiving surface of the CCD 13. The elements of such an optical arrangement with respect to which the condition is changeable are only the illumination stop 57 and the pupil filter 60. Accordingly, the simulator 34 effects the simulation while changing the condition of them, and discriminates an optimum combination (condition) according to which the signal light is best emphasized and the noise component is removed. The discriminated optimum setting condition is transmitted through the control circuit 35 to the stepper side. On the basis of the thus supplied instruction, the stepper 1 effects the setting change to the illumination stop 57 and the pupil filter 60.

Referring to FIGS. 4A through 4D and 5A through 5D, the operation of the simulator 34 will be explained in detail. In FIG. 4A, a filter 201 has an aperture 202 of a radius $r_1$ at the center thereof, and this filter corresponds to the illumination stop 57 in FIG. 2. Another filter 203 has a ring-like aperture 204 (FIG. 4B), having an inner diameter $r_2$ and an outer diameter $r_3$. The filter 203 corresponds to the light receiving side stop 60 in FIG. 2. The filters 201 and 203 are disposed in an optically conjugate relationship with the pupil position of the optical system 10. Therefore, they serve as a filter for restricting the angular information of incidence and reflection of light, in an imaging plane (in the case of FIG. 2, it corresponds to the surface of the wafer 5, the surface of the reticle 8 or the tube surface of the CCD 13).

In FIG. 4C, when the surface step profile 205 of the wafer mark as well as the profile 206 of the resist surface, having been measured by using the laser microscope 30 (FIG. 1) are considered, the light passed through the illumination stop 201 illuminates the wafer at an angle not greater than $\theta_1$ with respect to the optical axis 207. Thus, only those rays of the light reflected by the wafer, having an angle not less than $\theta_2$ and not greater than $\theta_3$ with respect to the optical axis 207, can be transmitted to the CCD 13. Since each of the pupil filters 201 and 203 is circular with respect to the optical axis 207, the angle $\theta_1$, for example, applies to a direction perpendicular to the sheet of the drawing, and the expression "not greater than $\theta_1$" means conical. However, here, the step 208 of the wafer will be explained two-dimensionally, as a rod-like structure extending in the direction perpendicular to the sheet of the drawing.

In the simulator 34, the light flux passed through the illumination stop 201 is considered as a bundle of beams of a number necessary and sufficient for the analysis and, in the neighborhood of the wafer surface step 208, ray tracing is made to each of the beams. For example, as illustrated at the left hand side of FIG. 4C, for one sample inputted beam 210, tracing is made to a light beam 211 reflected by the resist surface; a light beam 214 passed (212) through the resist, reflected (213) by the wafer surface 205 and passed through the resist; and a light beam 217 once reflected (213) by the wafer surface and then reflected (215) by the resist surface (i.e. multi-reflected (216) between the resist and the wafer) and then passed through the resist. Of the light beams 211, 214 and 217 directed back to the microscope 30, one or those that cannot pass through the aperture 204 of the filter 203 (the beams 211 and 217 in the FIG. 4C, are excluded. As regards the beam or beams (the beam 214 in FIG. 4C), that can pass through the aperture 204, the intensity of the outputted light beam with respect to the unit inputted intensity is calculated, while taking into account the reflection factor of the resist surface, the transmission factor of the resist and the reflection factor of the wafer. It is to be noted that, for higher precision simulation, it is necessary to take into account the phase of the light.

In summary, the simulator 34 discriminates, for one sample inputted beam, only those reflection beams that can pass through the filter 203, and with regard to each of them, the simulator 34 memorizes into a memory the results of simulation such as, for example, the position of emission, the angle of emission, the intensity and the phase of the reflection beam. When the results of simulation made to the respective sample beams are combined, they can be depicted as bundles of beams such as those illustrated in the right-hand side portion of FIG. 4C. From the obtained results, it is seen that, to a group 222 of light beams reflected by an upper edge 225 of the wafer surface step 208 which is the very alignment target as well as a group 223 of light beams reflected by a lower edge 226, there are groups 220 and 221 of reflection beams from the resist surface, which cannot be called a "signal", and which are mixed with the very "signal light" 222 and 223 and are received by the CCD 13 of FIG. 2.

Further, the simulator 34 serves to calculate an expected light intensity distribution (electric signal distribution) to be formed by these light beams on the light receiving surface of the CCD. Simply, this calculation is the sum of the light intensity with respect to each position. Precisely, however, the calculation is made while taking into account the phase of light, namely, the interference effect. The result is illustrated at 230 in FIG. 4D. As is clear from FIG. 4C, the signal from the wafer edge and the resist surface reflected signals emerge from substantially the same position. Consequently, as compared with the signal 231 provided only by the light beams 222 and 223, the signal 230 is distorted largely. Therefore, it can be discriminated that the combination of the filters 201 and 203 is improper for the detection to this sample wafer.

Accordingly, the simulator 34 or the control circuit 35 of the pattern analyzing device 20 tries another simulation, in another combination of the illumination stop 57 and the pupil filter 60, in FIG. 2, of the alignment optical system 12 of the stepper 1. An example of a substituting combination will be explained, with reference to FIGS 5A through 5D. In this example, as illustrated in FIGS. 5A and 5B, an illumination stop 250 and a light receiving side stop 253 have similar ring-like aperture 251 and 254, respectively.

In FIG. 5C, the illumination light irradiates the wafer with an angle not less than $\theta_2$ and not greater than $\theta_3$, and similarly the light receiving side stop allows passage of only the reflection light of an angle not less than $\theta_2$ and not greater than $\theta_3$ and intercepts the light other than this. The wafer profile 205 and the resist profile 206 are similar to those shown in FIG. 4C.

In the combination of these stops, at planar areas of the resist surface and the wafer substrate surface which are perpendicular to the optical axis, all the resist surface reflected light and the wafer surface reflected light go through the aperture 254 of the light receiving side stop 253 and are projected on the CCD 13. These light fluxes are illustrated as fluxes 260, 261 and 262. As compared therewith, as regards a light beam (e.g. 263) which is inputted to such a portion in which only the resist surface is inclined, the resist surface reflected light 264 is one approximately along the optical axis (i.e. the angle is not greater than $\theta_1$), and the angle of a beam 267 reflected (265-266) by the wafer surface and emerging out of the resist becomes greater than $\theta_2$. Both of them are intercepted by the light receiving side stop 253. Also, a portion of the light scattered by the edges (225, 226 and the like) of the wafer surface step, provides a signal light comprising light fluxes 270-273. They are received by the CCD 13 and, when depicted in the form of a light intensity signal, that illustrated in FIG. 5D is obtained. Here, while an external disturbance light and a true signal light are present mixedly, they are separated positionally (in the X direction). It will be understood therefore that correct position detection is attainable by executing the signal processing limitedly to those regions not less than a and not greater than b.

Referring back to FIG. 3, the simulation signal obtainable as a result of the optimum setting as described above, is such as depicted by a broken line in FIG. 3B, for example. However, this signal itself still contains an external disturbance component and a noise component. Namely, only by the adjustment of the optical arrangement, it is not possible to completely avoid the effects such as, for example, that of reflection light 43 from the resist surface, that of film interference 44 by the reflection at the resist surface and the substrate surface, and the like. The signals which are in essence necessary for the alignment are the lights such as at 45 and 46 which are diffracted by the edge portion of the alignment mark 42. The lights 43 and 44 are not the signals in essence.

Accordingly, in the simulator 34, not only is the simulation signal of FIG. 3B computed on the basis of the ray tracing, but also the analysis is made to discriminate the portion that contains a greater amount of true signal and, additionally, to discriminate the degree of effect of the surface reflection or the film interference to that portion. From the results of analysis, a best processing algorithm according to which the signal processing system of the stepper 1 should operate, is discriminated and the corresponding information and instruction are transmitted to the stepper 1 side through the control circuit 35.

For example, in the case of FIG. 3B, the information is such that a large amount of edge information is included in the hatched portions or such that how many percentages the signal level of the right-hand region is higher than that of the left-hand region. At the stepper 1 side, for processing of the imagewise information signal from the CCD 13 for the alignment purpose, it is general that the central value of such an imagewise information signal is detected in accordance with a symmetry method or a moment method. If, for example, the symmetry method is to be used, the center may be determined by effecting signal processing only with respect to the data related to the region from $\pm(A)$ to $\pm(A+B)$, (or with increasing the weight of this region) while, additionally, changing the weights of the left and right regions. For example, in a case when such a signal distortion results from the resist application characteristic at the time of resist spin coating and there is a possibility of occurrence of radial errors about the center of the wafer, at the wafer pattern analyzing device side the above-described analysis may be made with regard to the central shot area of the sample wafer and to a few shot areas around it, and the results may be transmitted to the stepper 1 side. In response to reception of the results, at the stepper 1 side it is possible to execute the signal processing while changing the weight in accordance with the position of each shot area on the wafer.

The symmetry method is such that: When an output of the k-th picture element of a plurality of picture elements which are arrayed in a predetermined direction (e.g. X direction) on the light receiving surface of the CCD 13 is denoted by f(k), by using the outputs of picture elements of a number $I_0$ in each of the positive and negative directions from the j-th picture element, the following calculation is made:

$$M(j) = \sum_{i=0}^{I_0} [f(j-i) - f(j+i)]$$

Of various M(j) obtained by making calculations while repeatedly shifting "j" by a predetermined magnitude, the position of the minimum "j" is discriminated as the center of the image signal from the CCD 13, with respect to the X direction. Also, the moment method is one for detecting the center by calculating M(j) in accordance with the following equation:

$$M(j) = \sum_{i=0}^{I_0} [i \times f(j-i) - i \times f(j+i)]$$

In the embodiment described above, the analyzing device 20 is arranged to transmit the results of analysis and simulation to the stepper 1 side. However, the analyzing device 20 may be provided with a detection optical system the same as that of the stepper 1 (for example, a detection optical system which is the same in respect to the wavelength of the irradiating light, the angle of irradiation of the illumination light to the wafer and the angle of reception of the reflection light from the wafer which is not less than $\theta_2$ and not greater than $\theta_3$ in FIG. 5C as well as a signal processing system the same as that of the stepper 1. This makes the system more effective. The signal processing system may be used also as the processing system at the stepper 1 side. If this is done, in the analyzing device 20 it is easily possible to compare the results of simulation (signal) with the signal from the detection system of the stepper 1 side and, therefore, it is possible to detect the result beforehand. The advantages of this will be understood, without specifically mentioning them.

Further, in the embodiment described above, the wafer pattern analyzing device 20 effects the analysis to a wafer already coated with a resist. If a resist coater and developer is combined with the analyzing device to provide an in-line structure or a systematic structure, more effective and flexible adaptability is ensured.

FIG. 6 is a plan disposition view of one embodiment of an in-line structure. In the sheet of the drawing, about the pattern analyzing device 20 (upper middle), a stepper main assembly 1 is at the right hand side, a coater 72 is at the lower left and a developer 73 is at the upper left. For transfer of wafers between these four systems, a wafer conveying system 74 is disposed at the central part. Denoted at 75 and 76 are buffer portions for adjusting the height of wafer conveyance between the stepper 1 side and the coater/developer 70 side. A wafer cassette for accommodating wafers therein is disposed above the conveying system 74. Denoted at 77 and 78 are wafer hands each being expansible/contractable, rotatable and upperwardly/downwardly movable. These wafer hands are designed to allow transfer of wafers to and from each system. Sliders 79 and 80 including mechanical portions of the hands 77 and 78 are movable along a Y axis 81 and, by the operation of these slider S, the supply and collection of wafers from and to the wafer cassette as well as the supply and collection of wafers to and from each of the analyzing device 20, the stepper 1, the coater 72 and the developer 73, can be made.

Figure 7:
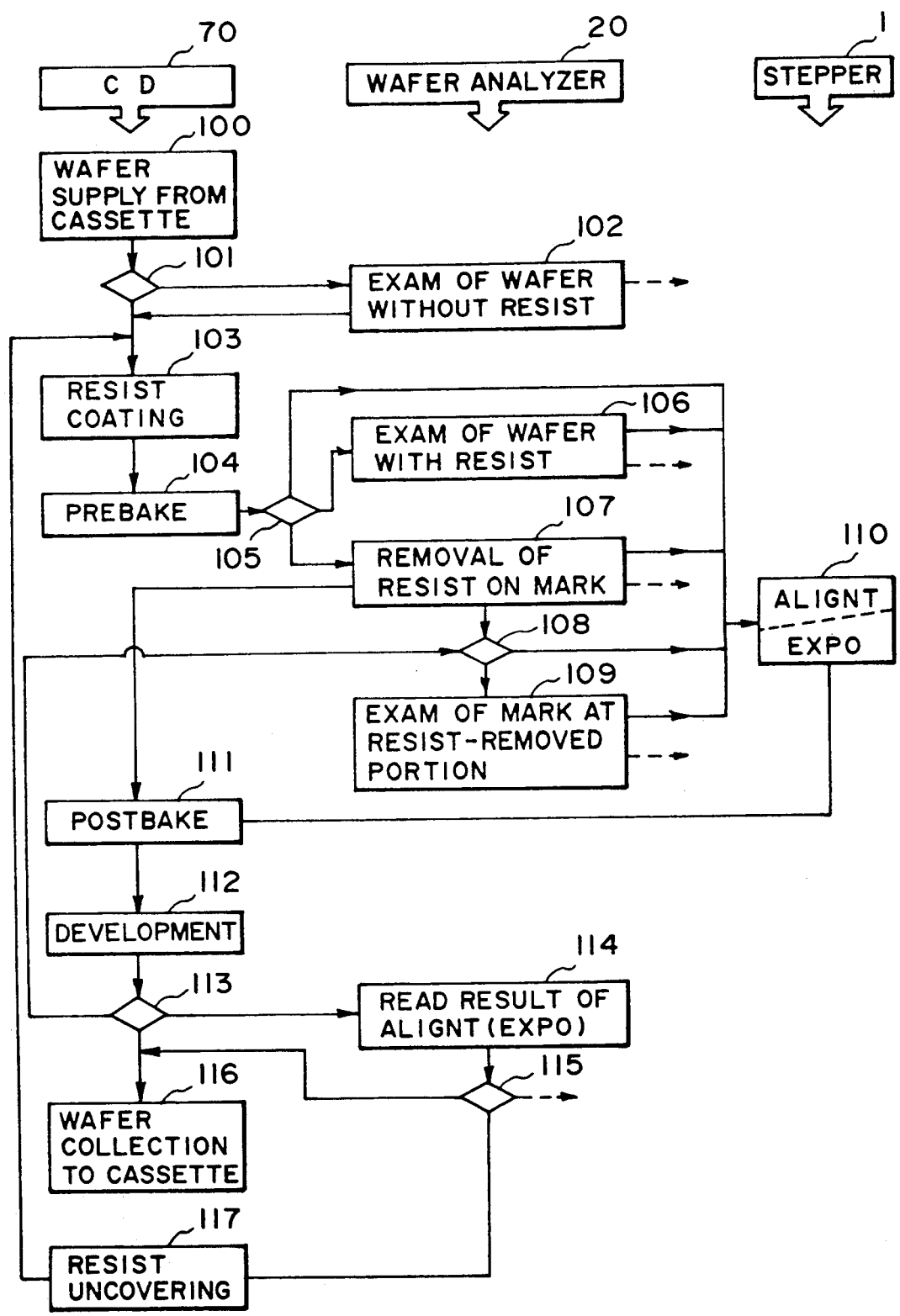
FIG. 7 is a flow chart, illustrating the operation of the FIG. 6 embodiment.

The transfer of wafers in accordance with the present invention wherein the system shown in FIG. 6 is used, is illustrated in the flow chart of FIG. 7. FIG. 7 illustrates the coater/developer 70, the wafer analyzing device 20 and the stepper 1 each in the form of vertically arrayed blocks. Their operations are depicted by rectangular blocks arrayed downwardly, the branch is depicted by a lozenge and the flow of a wafer is depicted by solid-line arrows. Broken-line arrows depict the transmission of instruction, information and data to the stepper 1 from the wafer analyzing device 20. Discrimination at each branch is made by the control circuit 14 of the stepper 1 or the control circuit 35 of the analyzing device 20, in accordance with preparative selection by an operator.

The flow chart of FIG. 7 illustrates a few embodiments together. The respective embodiments will be explained with reference to FIGS. 8A-8F. Of the various steps shown in FIG. 7, steps 100, 103, 104, 111, 112, 116 and 117 show various operations of the coater/developer 70. Steps 102, 106, 107, 109 and 114 show various operations of the wafer pattern analyzing device 20. Step 110 shows the operation of the stepper 1. Further, step 101 is a step for discriminating whether, to a wafer supplied from the cassette at step 100, the examination should be made at step 102 in the condition of absence of a resist. Step 105 is a step for discriminating whether a wafer prebaked at step 104 should be directly fed to step 110 for exposure thereof or it should be fed to a step 106 for examination of a resist coated wafer or to a step 108 for partial removal of a resist at the mark portion. Step 108 is a step for discriminating whether a wafer from step 107 should be directly fed to the step 110 or to step 109 for examination of the mark at the resist moved portion. Step 113 is a step for discriminating whether a wafer developed at step 112 should be collected at step 116 or it should be fed to step 114 for reading the result of exposure. Step 115 is a step for discriminating whether a wafer from step 114 should be collected at step 116 or it should be fed to step 117 for resist uncovering (complete removal). At each of these discrimination steps, as described hereinbefore, a desired selection is made in accordance with the preparative setting made by the operator. In the description to be made later with reference to FIGS. 8A-8F, explanation of these discrimination steps will be omitted only for convenience.

Figure 8A:
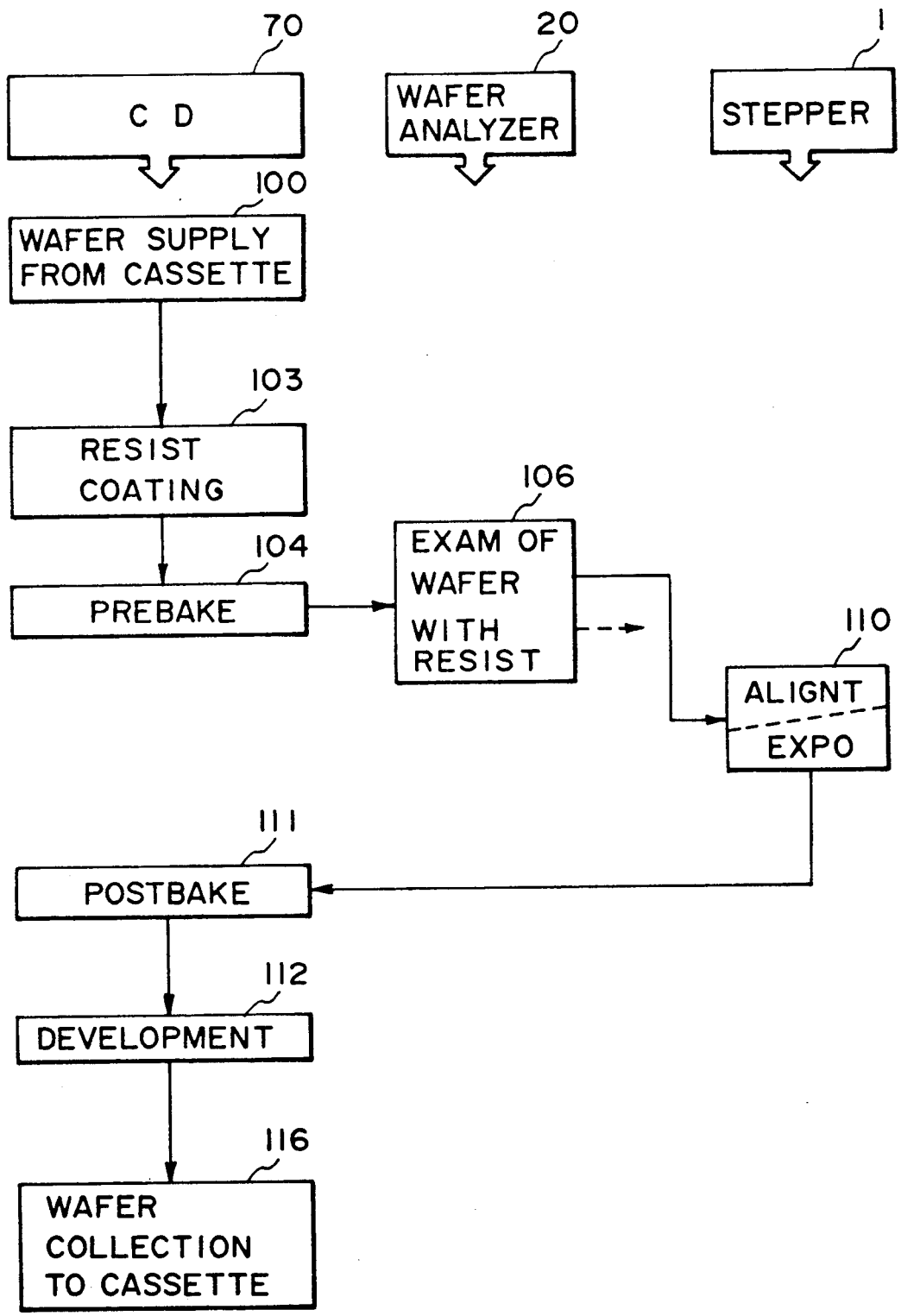
FIGS. 8A-8F are flow charts, illustrating details of the FIG. 7 embodiment.

If the first-mentioned embodiment operates in accordance with the illustrated system, as shown in FIG. 8A, the procedure is such that: supply of a wafer from the cassette at step 100; resist coating at step 103; prebaking at step 104; examination of a resist coated wafer at step 106; step-and-repeat exposure at step 110; postbaking at step 111; development at step 112; and wafer collection at step 116. As described hereinbefore, owing to the advantageous effects of the present invention, a wafer having been subjected to the step-and-repeat exposure at step 110 can be processed at a precision excelling that which is conventional.

Figure 8B:
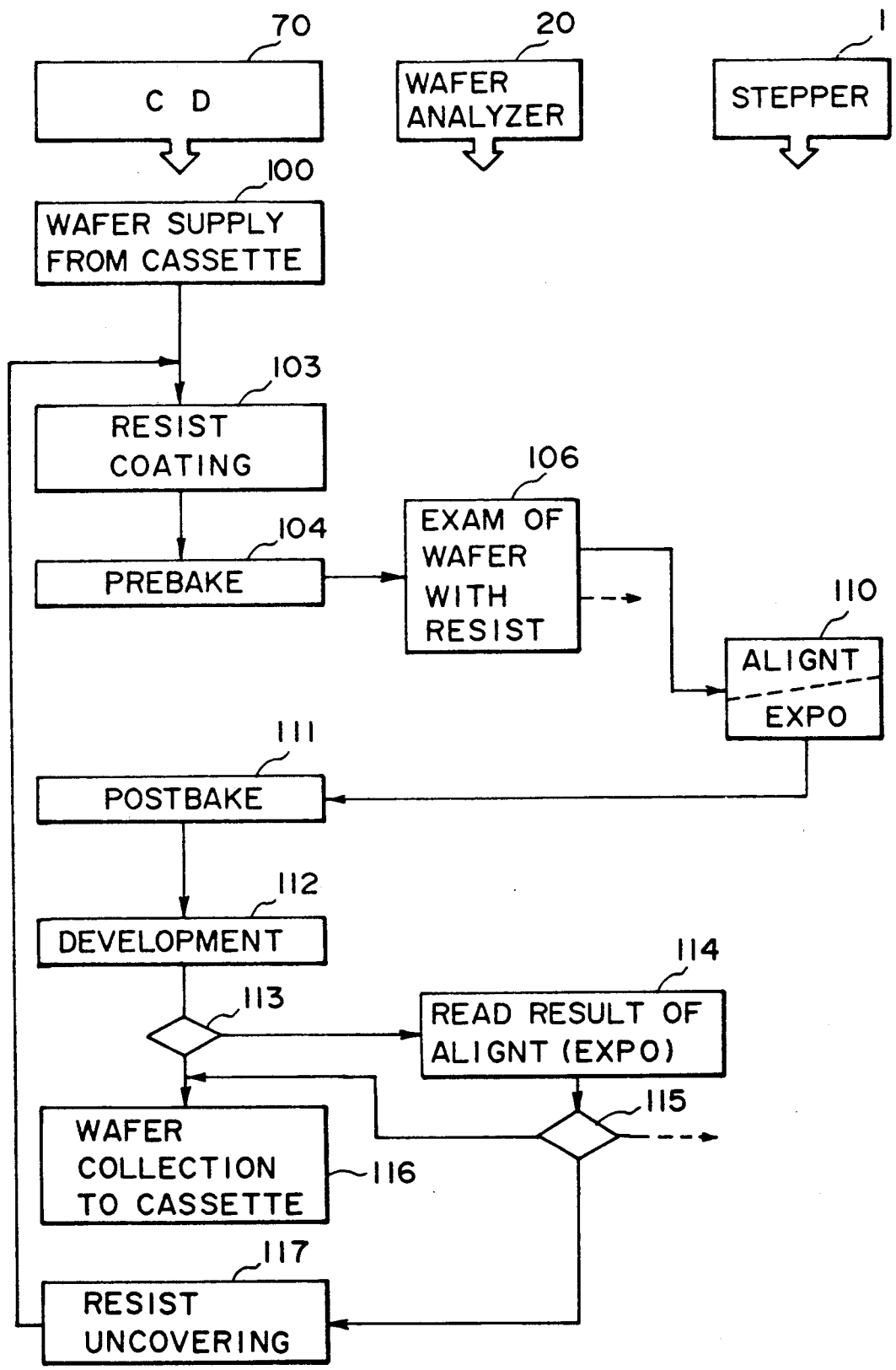

As another embodiment, examination of an exposed wafer as illustrated in FIG. 8B will be explained. A wafer exposed at step 110 is transferred to the developer 70. Only by completion of the postbaking at step 111 and the developing process at step 112, it is first rendered into an "observable state" in the form of a resist pattern. In accordance with the discrimination at step 113, the wafer is returned back to the wafer pattern analyzing device 20 for discrimination of the alignment result. Then, at step 114, the precision discrimination is made with regard to a plurality of sample shot areas of the wafer. As regards the precision distribution to be examined in this embodiment, a particular note will be paid to errors having some regularity, that is, uniform X-Y shift, radialness (magnification) or otherwise, rather than a random error component. This is because the random component results mainly from the performance of the detection system and it is difficult to avoid the same spontaneously. As compared therewith, it is easy to correct errors having a regularity. The result of this may be fed back to the processing system 14 of the stepper 1 or, alternatively, an instruction may be made to apply an offset of a certain amount to the stepper 1 side. By this, high-precision alignment and exposure process (step 110) is ensured for the succeeding wafers. The sample wafer itself may be collected into the wafer cassette at step 116 if, according to the discrimination at step 115, the precision is within a certain tolerance. If the precision is out of the tolerance, the wafer will be fed back to the coater/developer 70 and, after the resist uncovering (complete removal) at step 110, it will be fed back to step 103 for resist coating.

Figure 8C:
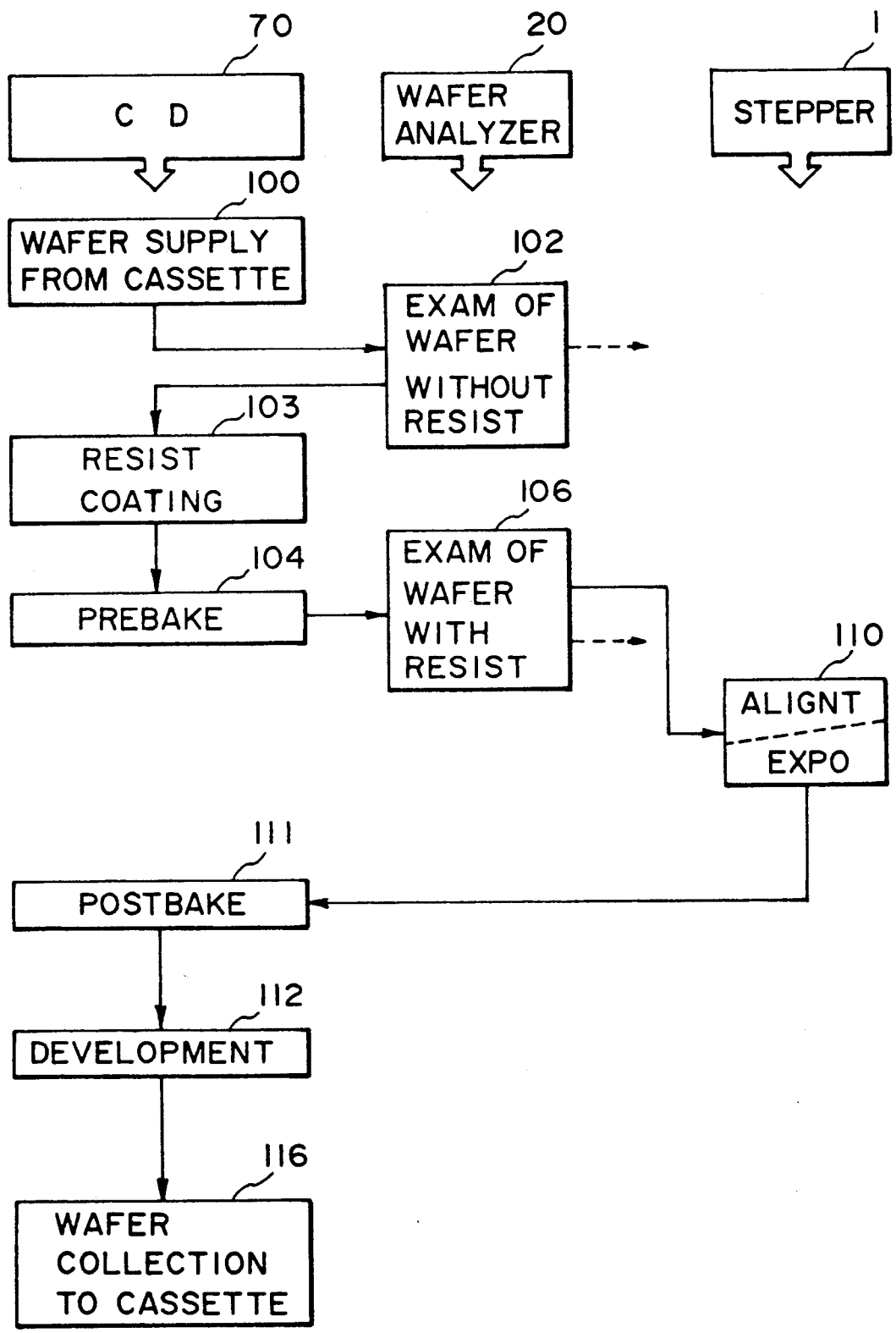

The embodiment shown in FIG. 8C is the one in which, at an early stage of the FIG. 8A embodiment, analysis is to be made to a sample wafer before resist coating. Thus, in the flow of FIG. 8A, a further step (step 102) for examination of a wafer having no resist is added between steps 101 and 103. The addition of this process provides two advantages. One is that, by using the laser microscope 30 described hereinbefore, the sectional shape of the wafer alignment mark can be measured more precisely. As a matter of course, this owes to the absence of the resist. Another advantage is that, by measuring the interval between shot areas in the case of absence of a resist (step 102) and in the case of resist coating (step 106) and by detecting any difference in the interval between these cases, it is possible to detect a "resist-deceived error". The measurement is made by using the microscope 30 and the laser interferometer 27. In this example, similarly to the foregoing example, the result may be fed back to the signal processing system 14 at the stepper side or, alternatively, an instruction is made to apply an offset of a certain amount to the stepper.

Figure 8D:
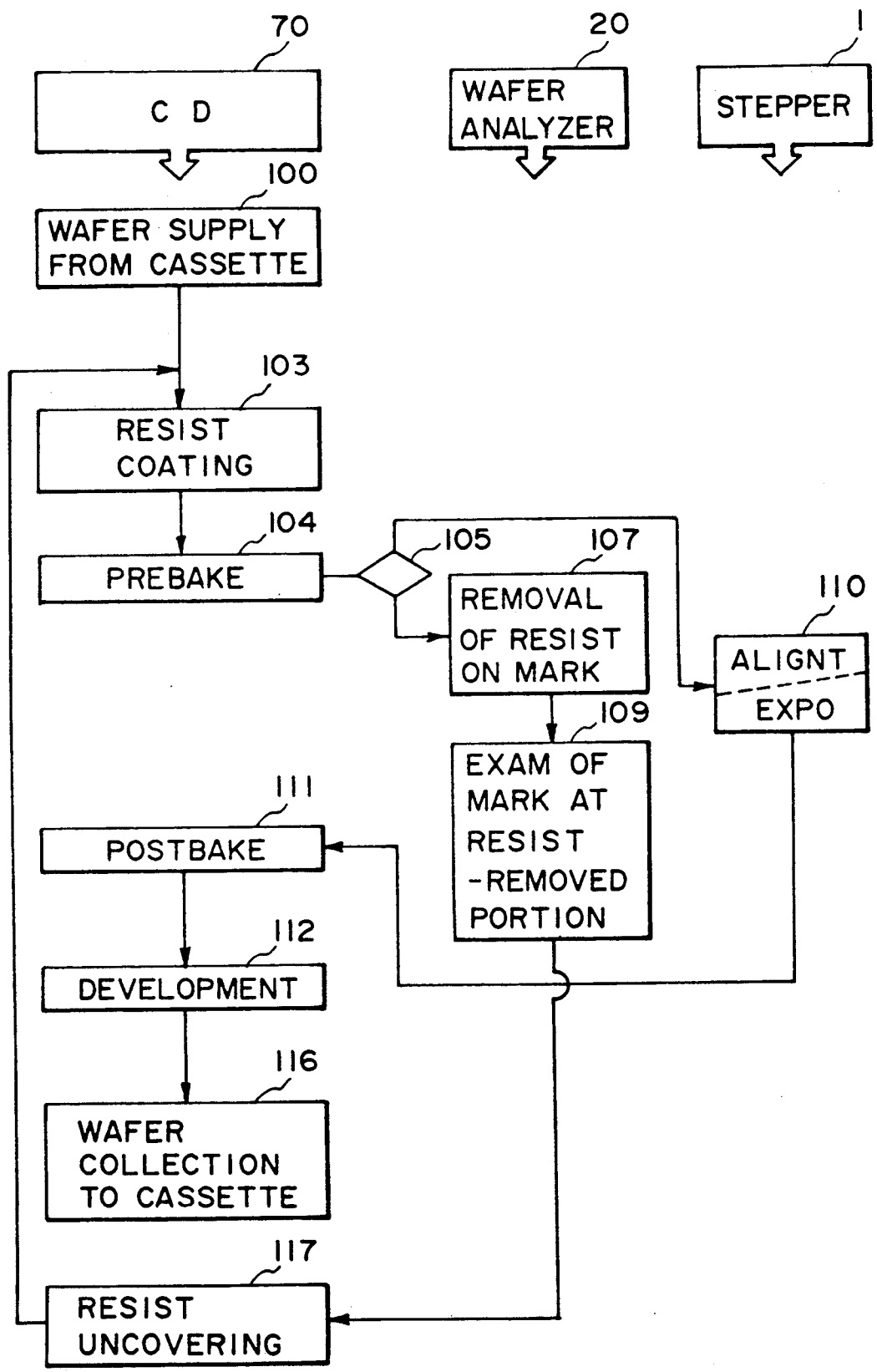
Figure 8E:
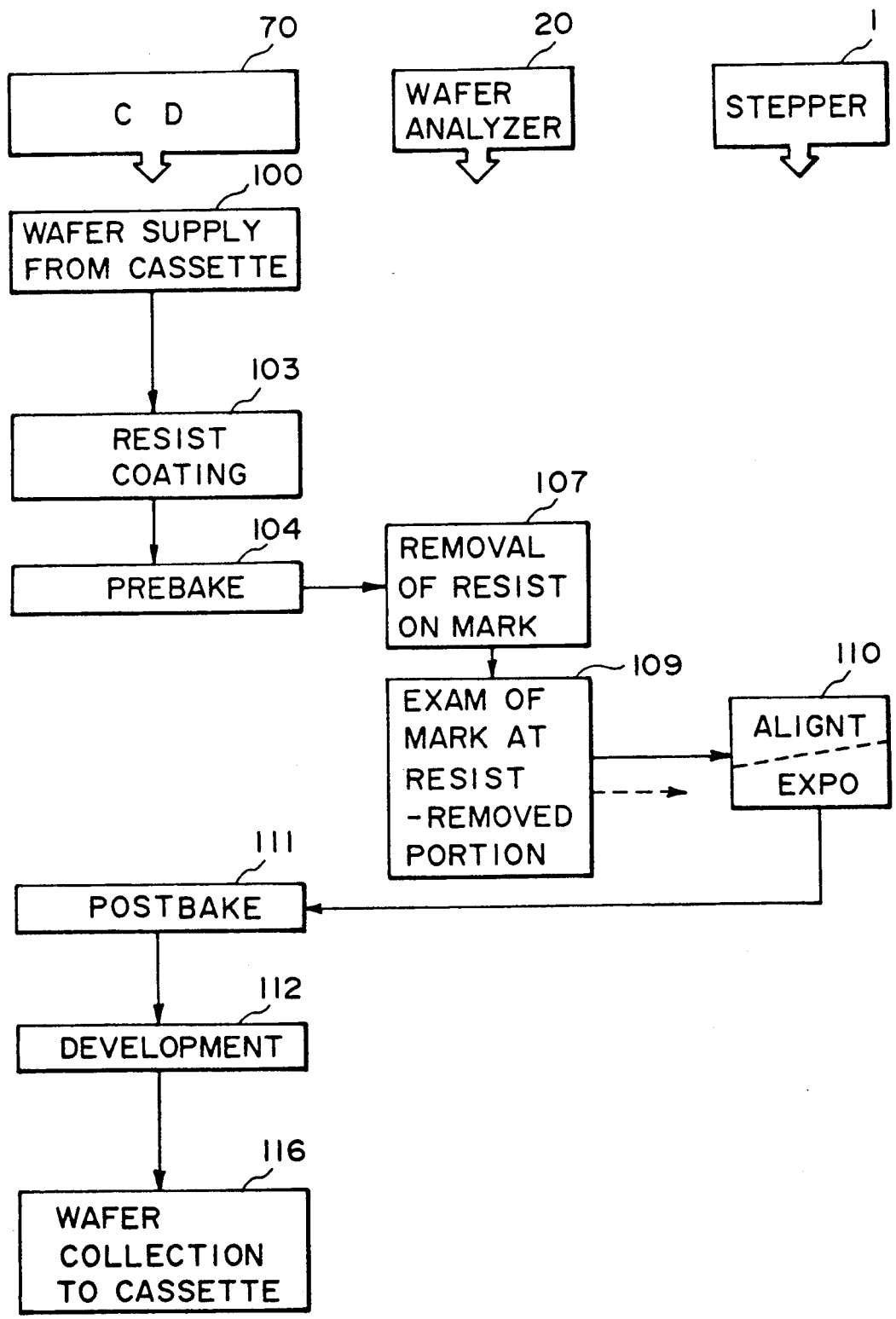
Figure 8F:
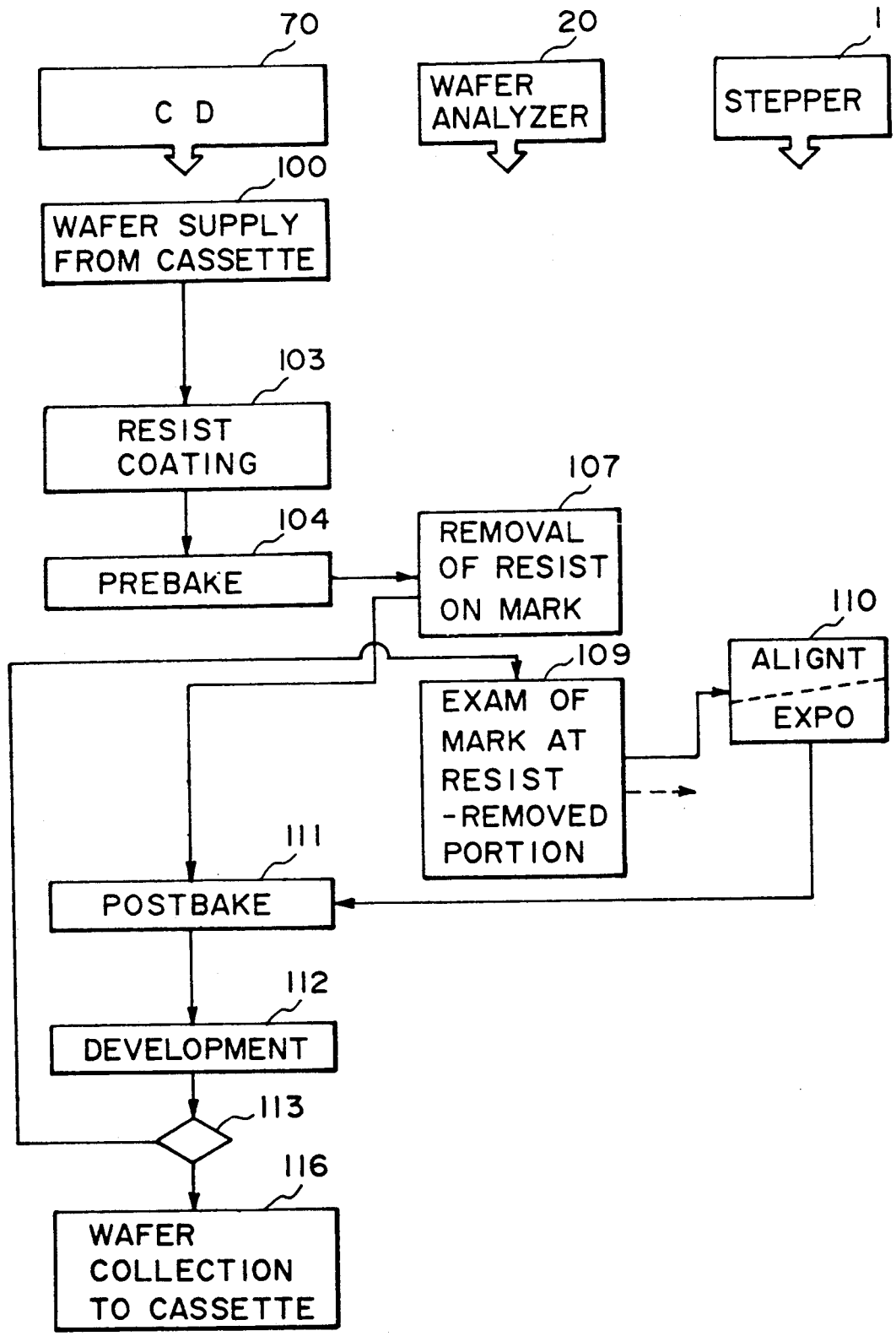

The embodiments shown in FIGS. 8D-8F are arranged so that, for a wafer once coated with a resist, a portion of the resist adjacent the alignment mark is removed at step 107 and, thereafter, at step 109 the mark in the resist-removed portion is examined. In order to assure this, it is necessary to add an exposure optical system to the microscope 30 of the analyzing device 20. From the end of these embodiments, a precision of a few microns is sufficient for the positioning of a wafer at the time of exposure. Therefore, the provision of an exposure optical system adjacent the alignment optical system is sufficient. However, like an embodiment described hereinbefore, a detection optical system the same as that of a stepper 1, namely, one that uses alignment light substantially the same as the exposure light, may be provided also at the analyzing device 20 side. If this is desired, an optical system such as, for example, shown in FIG. 9 may be considered.

The optical system in this case has a structure which is quite similar to that of the stepper. However, the field of observation is small and it can be called a "mini-stepper". Since the optical system itself is not directly pertinent to the invention, it will be explained only briefly. Wafer 5 is placed below an objective lens 122, and a reticle 8' is placed in the course of the optical system. A $\lambda_E$-illumination system 123 which includes a light source 124 having a wavelength $\lambda_E$ the same as the exposure light of the stepper 1, provides an illumination light which, after passing beam splitters 133 and 134, illuminates the reticle 8'. After passing a beam splitter 135 and a $\lambda_E$-projection system 140 (beam splitter 137), the pattern of the reticle 8' is imaged on the wafer 5. The light reflected by the wafer 5 goes along its oncoming path and is plane-imaged on the reticle 8' and, additionally, by way of the beam splitters 134 and 133 it is received by a detector 125 of a $\lambda_F$-detection system 126, whereby it is converted into an electric signal.

A $\lambda_1$-illumination system 128 has a light source 127 and projects the light from its light source to the wafer 5 by way of a beam splitter 136 and a $\lambda_1$-projection system 141 (mirror 138 and beam splitter 137). The light reflected by the wafer 5 goes inversely along the objective lens 122, the beam splitter 137, the mirror 138 and the beam splitters 136 and 135, in this order, and is imaged on the reticle 8'. Further, through the beam splitter 134, the light is received by a detector 130 of a $\lambda_1$ and $\lambda_2$ detection system 129, whereby it is converted into an electric signal. Further, a $\lambda_2$-illumination system 131 is provided exclusively for reticle illumination. Light emanating from a $\lambda_2$-light source 132 goes by way of the beam splitters 136 and 135 to illuminate the reticle 8', and its shadow pattern is received by the $\lambda_1$ and $\lambda_2$ detection system 129.

Figure 9:
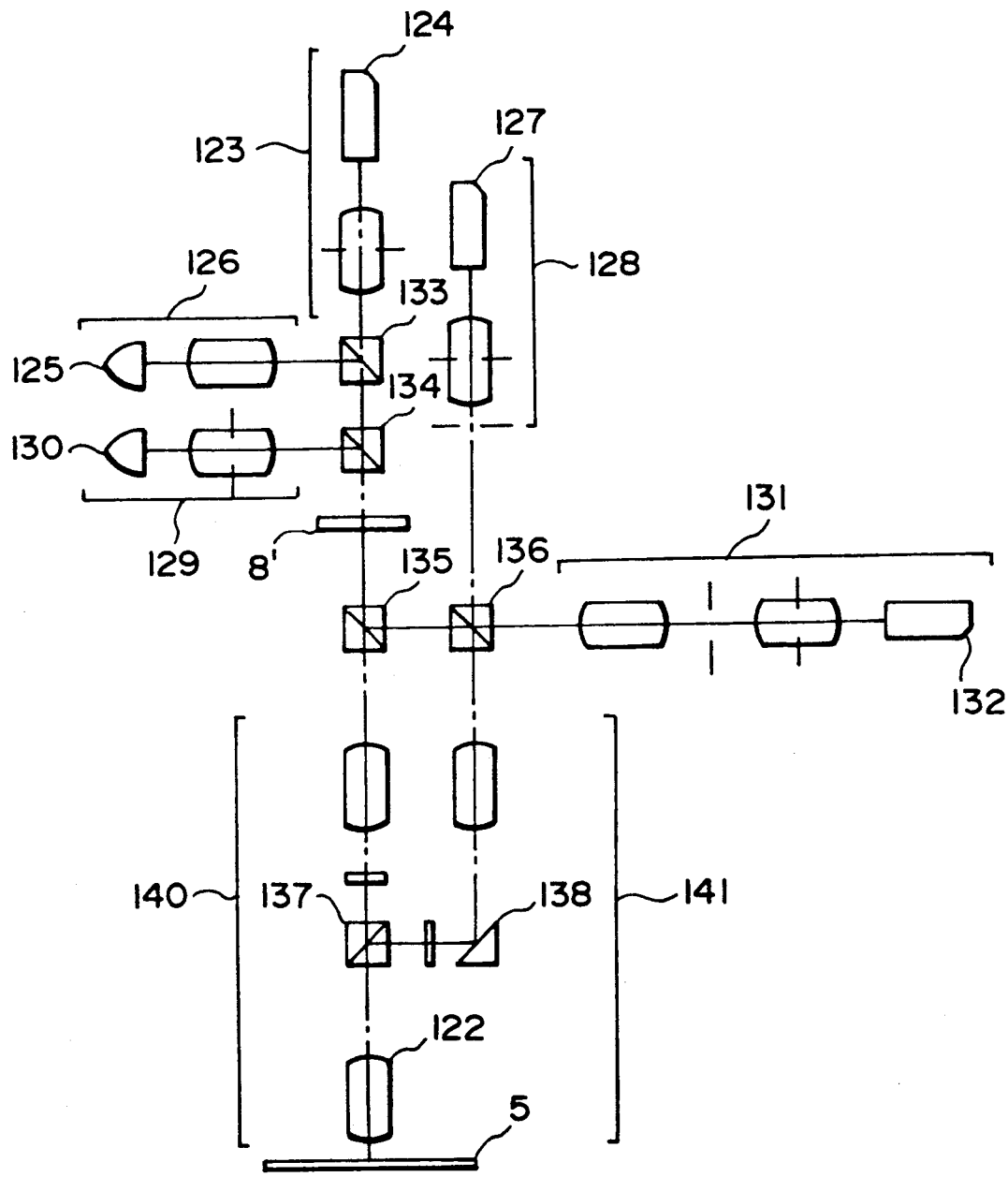
FIG. 9 is a schematic view showing an example of an alignment and exposure optical system of a wafer pattern analyzing device according to the present invention.

It will be understood from the foregoing that the optical system exemplified in FIG. 9 has a function of a wafer pattern analyzing device and, at the same time, has a function of an exposure apparatus. In this example, the reticle 8' serves as a reference for the microscope at the time of alignment analysis, and it plays a role of a pattern original when the device is used as an exposure apparatus.

Referring back to the embodiments of FIGS. 8D-8F, to be exact, each embodiment may be separated into two embodiments. Namely, (a) a method of removing a resist on the whole region of the alignment mark, and (b) a method in which a transferred pattern of the reticle (that is, a resist image) is left in the alignment mark region. Further, two different types may be considered as the means for partially removing the resist. That is, (I) a method that uses as an exposure light an intense pulsed light of an excimer laser, for example, so that the resist is directly removed by the irradiation of light, and (II) a method in which an ordinary exposure is applied and the resist is selectively removed by the development.

The end of the embodiment (a) is to improve the alignment precision independently of the methods (I) and (II) because no resist is present on the alignment mark when the alignment operation is made at the stepper side. The process in itself is well known in the art. In this case, to each of the wafers, this process is to be made. By using FIG. 7, the flow is such as follows:

Embodiment of (a)-(I):
The flow comprises steps 100, 101, 103, 104, 105, 107 and 110.

Embodiment of (a)-(II):
The flow comprises steps 100, 101, 103, 104, 105, 106, 107, 111, 112, 113, 108 and 110.

As for the method of (a), it can be embodied by using a system structure such as shown in FIG. 6.

Figure 10A:
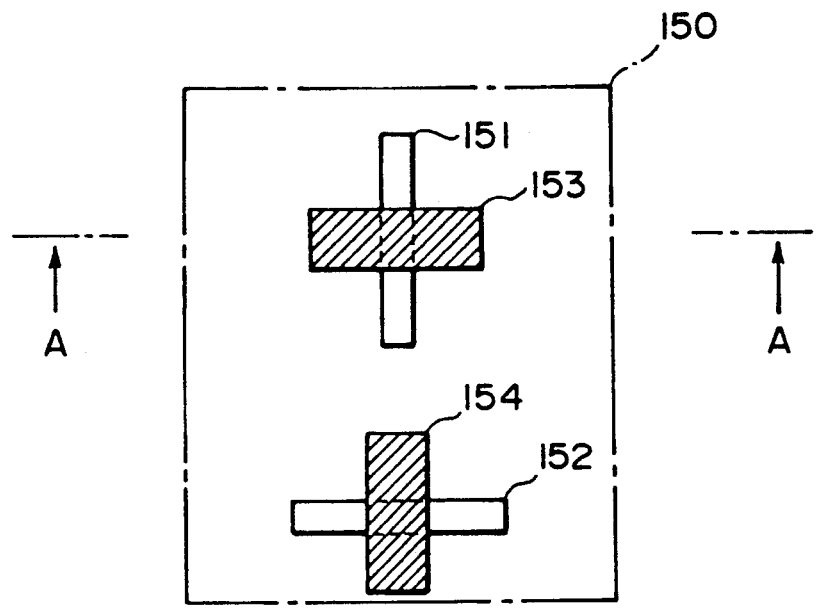
FIGS. 10A and 10B are schematic views, for explaining partial removal of a resist on an alignment mark of a wafer.
Figure 10B:

The end of embodiment (b) is the analysis. FIG. 10A shows the state in which, to an X alignment mark 151 and a Y alignment mark 152 formed in the alignment mark region 150, a resist is left only in the portions 153 and 154 depicted by hatching. FIG. 10B shows the section on a line A—A in FIG. 10A. By executing the analysis to each local block of the alignment mark which is in the illustrated state, it is possible to analyze any difference in signal between a portion covered by the resist and a portion having no resist as well as the degree of shift of the value of the detected center, detected by the symmetry method, for example, as affected by the presence and absence of the resist.

The embodiments of FIGS. 8D-8F each is sample analysis, and it is not necessary to execute the analysis to every wafer. With regard to those wafers having been used as samples, there are two cases, i.e. (i) the whole resist is removed and a fresh resist, is applied again, and (ii) the sample wafer is transferred directly to the stepper 1 and a mark which is at a portion different from the alignment mark having been used in the analysis, is used.

In these embodiments, the processes of the coater/developer 70, the wafer analyzing device 20 and the stepper 1 are executed in the following manner:

Embodiment (b)-(I)-(i) of FIG. 8D:
The processes are executed in the order of steps 100, 103, 104, 105, 107, 108, 109, 117, 103, 104, 105, 110, 111, 112 and 116.

Embodiment (b)-(I)-(ii) of FIG. 8E:
The processes are executed in the order of steps 100, 103, 104, 105, 107, 108, 109, 110, 111, 112 and 116.

Embodiment (b)-(II) of FIG. 8F:
The processes are executed in the order of steps 100, 103, 104, 107, 111, 112, 113, 109, 110, 111, 112, 113 and 116.

Figure 11:
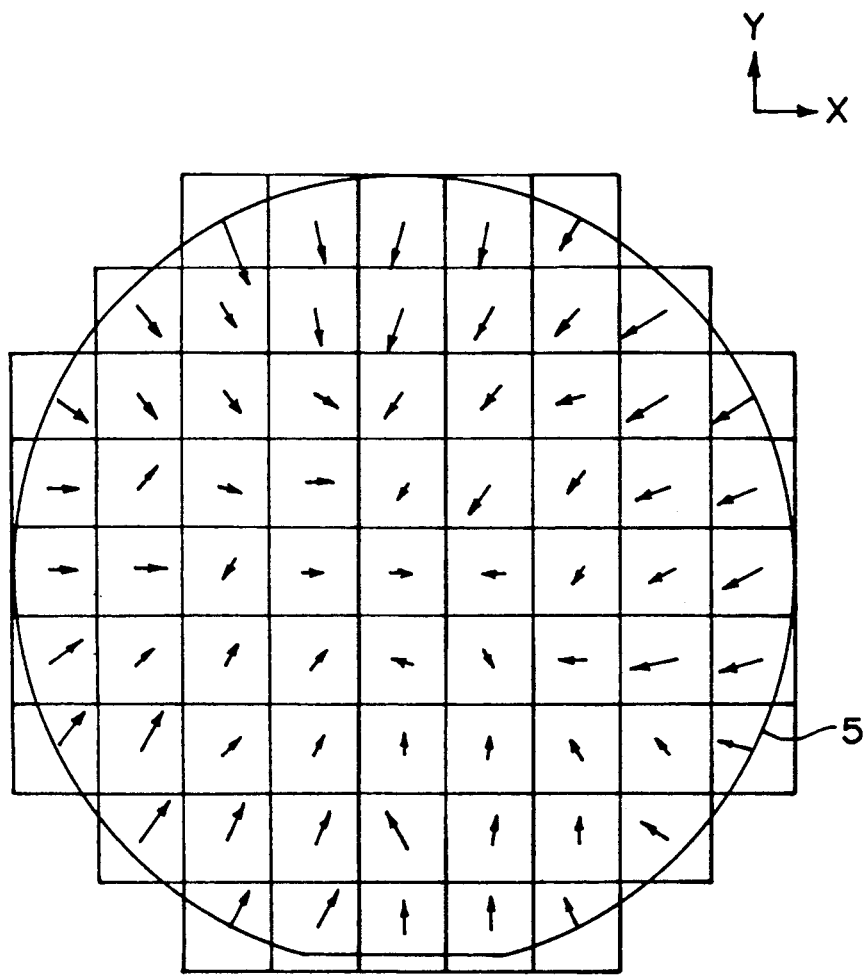
FIG. 11 is a schematic view, illustrating alignment errors (radially distributed errors) produced on a wafer.

The results of analysis obtained from these processes are used, as the foregoing embodiments, for the setting of parameters of the detection optical system at the stepper 1 side or for the setting of signal processing algorithm at the stepper 1 side. Of course, there is a simple method in which, when there is a radial error tendency such as illustrated in FIG. 11, from the data the radialness (the error component coefficient proportional to the distance r from the center) is applied to the stepper, so that at the stepper 1 side the corresponding amount is applied to the alignment position as an offset and exposure is made accordingly.

In accordance with the present invention, as described hereinbefore, a wafer pattern analyzing device is introduced, by which it is made possible to finely analyze the characteristics of the alignment mark portion and to transmit the results of analysis to the stepper side. As a consequence, regardless of a small degree of freedom of an alignment detecting system of the stepper, it is possible to prepare an optimum detection optical system and an optimum signal processing algorithm, for wafer processing. Therefore, the processing time can be reduced and, additionally, the alignment precision can be enhanced remarkably.

Further, when the system is combined with a coater/developer into an in-line structure, it is possible to execute the resist partial removal process and also to use the system as an inspecting machine for discriminating the result of alignment and exposure. Thus, it is possible to provide a flexible system which can be used for a different purpose, in addition to an analyzing device.

While the invention has been described with reference to the structures disclosed herein, it is not confined to the details set forth and this application is intended to cover such modifications or changes as may come within the purposes of the improvements or the scope of the following claims.

What is claimed is:

1. An exposure system for exposing a wafer coated with a resist, to a mask, said system comprising:
 a projection optical system for projecting a pattern of the mask to the wafer to print the mask pattern on the resist of the wafer;

a first detector for photoelectrically detecting an alignment mark formed on the wafer through said projection optical system to produce a mark signal;

a second detector for photoelectrically detecting the wafer, without using said projection optical system, to produce a detection signal;

analyzing means for analyzing an affect of the resist of the wafer upon the mark signal produced by said first detector, on the basis of the detection signal produced by said second detector; and control means for controlling the position of the wafer in relation to the mask, in accordance with the mark signal produced by said first detector and a result of analysis by said analyzing means.

2. A system according to claim 1, wherein each of said analyzing means and said control means includes a stage for moving the wafer.

3. A system according to claim 2, wherein said control means comprises a signal processing system for processing the mark signal produced by said first detector and wherein said analyzing means comprises a simulator for effecting simulation related to said projection optical system and said signal processing system, for determining the affect of the resist upon the mark signal.

4. A system according to claim 3, wherein said second detector comprises a laser scanning microscope which uses light of substantially the same wavelength range as light projected by said projection optical system for printing the mask pattern on the resist of the wafer.

5. An exposure system for exposing a wafer having a resist, to a mask, said system comprising:

a coater for applying the resist to the wafer;

a projection optical system for projecting a pattern of the mask to the wafer to print the mask pattern on the resist of the wafer;

a first detector for photoelectrically detecting an alignment mark formed on the wafer through said projection optical system to produce a mark signal;

a second detector for photoelectrically detecting the wafer, without using said projection optical system, to produce a detection signal;

analyzing means for analyzing an affect of the resist of the wafer upon the mark signal produced by said first detector, said analyzing means comprising means for selectively examining the wafer covered by the resist and the wafer not covered by the resist; and control means for controlling the position of the wafer in relation to the mask, in accordance with a mark signal produced by said first detector and a result of analysis by said analyzing means.

6. A system according to claim 5, wherein each of said analyzing means and said control means includes a stage for moving the wafer.

7. A method, for use with an exposure system including a projection optical system for exposing a wafer having an alignment mark and a resist to a mask pattern, for manufacture of semiconductor devices, said method comprising the steps of:

placing the wafer on a first stage;

photoelectrically detecting the wafer placed on the first stage, without using the projection optical system, to produce a detection signal;

predicting, by using an analyzer, at least one of an affect of the resist of the wafer, and an affect of a surface shape of the wafer, upon a mark signal to be obtained as a result of photoelectric detection of the alignment mark of the wafer through the projection optical system, on the basis of the detection signal produced;

placing the wafer on a second stage;

photoelectrically detecting the alignment mark of the wafer placed on the second stage through the projection optical system, to produce an actual mark signal;

controlling the position of the second stage on the basis of the mark signal actually produced and on the basis of a result of the prediction, to align the wafer with respect to the mask pattern; and exposing the wafer to the mask pattern through the projection optical system to print the mask pattern on the resist of the wafer.

* * * * *

UNITED STATES PATENT AND TRADEMARK OFFICE
CERTIFICATE OF CORRECTION

PATENT NO. : 5,120,134

DATED : June 9, 1992

INVENTOR(S) : Masao Kosugi

It is certified that error appears in the above-identified patent and that said Letters Patent is hereby corrected as shown below:

On title page,

IN THE TITLE OF THE INVENTION

"AFFECT" should read --EFFECT--.

IN THE ABSTRACT

Line 7, "affect" should read --effect--.

COLUMN 1

Line 2, "AFFECT" should read --EFFECT--;
Line 41, "called" should read --called an--; and
Line 67, "mirror" should read --mirror.--.

COLUMN 2

Line 3, "that the" should read --a--;
Line 5, "etching" should read --etching,--;
Line 7, "kind" should read --kinds--;
Line 8, "pattern" should read --patterns,--;
Line 22, "parameter" should read --parameters--; and
Line 53, "with" (first occurrence) should be deleted.

UNITED STATES PATENT AND TRADEMARK OFFICE
CERTIFICATE OF CORRECTION

PATENT NO. : 5,120,134

DATED : June 9, 1992

INVENTOR(S) : Masao Kosugi

It is certified that error appears in the above-identified patent and that said Letters Patent is hereby corrected as shown below:

COLUMN 5

Line 48, "case," should read --cases,--.

COLUMN 7

Line 38, "or" should read --of--; and
Line 39, "the FIG. 4C," should read --FIG. 4C)--.

COLUMN 9

Line 48, "When" should read --when--.

COLUMN 10

Line 32, "disposition" should be deleted; and
Line 50, "slider S," should read --sliders,--.

COLUMN 11

Line 10, "show" should read --shows--;
Line 22, "moved" should read --removed--; and
Line 51, "it is" should read --is it--.

COLUMN 12

Line 21, "owes" should read --is due to--; and
Line 68, "133 it" should read --133, it--.

UNITED STATES PATENT AND TRADEMARK OFFICE
CERTIFICATE OF CORRECTION

PATENT NO. : 5,120,134

DATED : June 9, 1992

INVENTOR(S) : Masao Kosugi

It is certified that error appears in the above-identified patent and that said Letters Patent is hereby corrected as shown below:

COLUMN 13

Line 64, "signal" should read --signals--.

COLUMN 14

Line 5, "resist," should read --resist--.

COLUMN 15

Line 7, "affect" should read --effect--; and
    Line 24, "affect" should read --effect--.

COLUMN 16

Line 1, "affect" should read --effect--; and
    Line 24, "affect" should read --effect--
(both occurrences).

Signed and Sealed this

Sixteenth Day of November, 1993

Attest:

BRUCE LEHMAN

*Attesting Officer*     *Commissioner of Patents and Trademarks*